(12) United States Patent
Lee et al.

(10) Patent No.: US 8,748,866 B2
(45) Date of Patent: Jun. 10, 2014

(54) NITRIDE SEMICONDUCTOR LIGHT EMITTING DEVICE

(71) Applicant: Samsung Electronics Co., Ltd., Suwon-si (KR)

(72) Inventors: Jong Hyun Lee, Seoul (KR); Sang Heon Han, Gyeonggi-do (KR); Jin Young Lim, Gyeonggi-do (KR); Young Sun Kim, Gyeonggi-do (KR)

(73) Assignee: Samsung Electronics Co., Ltd, Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/733,586

(22) Filed: Jan. 3, 2013

(65) Prior Publication Data
US 2013/0168639 A1 Jul. 4, 2013

(30) Foreign Application Priority Data
Jan. 4, 2012 (KR) .......................... 10-2012-0000870

(51) Int. Cl.
*H01L 29/06* (2006.01)
*H01L 31/00* (2006.01)

(52) U.S. Cl.
USPC .................................... 257/13; 257/E33.012

(58) Field of Classification Search
USPC ......................................................... 257/13
See application file for complete search history.

(56) References Cited

U.S. PATENT DOCUMENTS

| 2006/0056123 A1* | 3/2006 | Aoyagi et al. | 361/56 |
| 2006/0275937 A1* | 12/2006 | Aoyagi et al. | 438/22 |
| 2007/0045655 A1* | 3/2007 | Song et al. | 257/104 |
| 2013/0048939 A1* | 2/2013 | Zhang et al. | 257/13 |

FOREIGN PATENT DOCUMENTS

| JP | 2002-314129 A | 10/2002 |
| KR | 2006-0036713 A | 5/2006 |
| KR | 2008-0010136 A | 1/2008 |
| KR | 2009-0030650 A | 3/2009 |

* cited by examiner

*Primary Examiner* — Matthew Landau
*Assistant Examiner* — Igwe U Anya
(74) *Attorney, Agent, or Firm* — McDermott Will & Emery LLP

(57) ABSTRACT

A nitride semiconductor light emitting device includes first and second type nitride semiconductor layers. An active layer is disposed between the first and second type nitride semiconductor layers. A current spreading layer is disposed between the second type nitride semiconductor layer and the active layer. The current spreading layer includes first nitride thin films and second nitride thin films which are alternately laminated. The first nitride thin films have band gaps larger than those of the second nitride thin films. A first plurality of first nitride thin films are positioned at outer first and second sides of the current spreading layer. The first plurality of first nitride thin films have a thickness greater than that of a second plurality of first nitride thin films positioned between the first plurality of first nitride thin films.

19 Claims, 6 Drawing Sheets

NITRIDE SEMICONDUCTOR LIGHT EMITTING DEVICE

CROSS-REFERENCE TO RELATED APPLICATIONS

This application claims the priority to Korean Patent Application No. 10-2012-0000870 filed on Jan. 4, 2012, in the Korean Intellectual Property Office, the disclosure of which is incorporated herein by reference.

TECHNICAL FIELD

The present application relates to a nitride semiconductor light emitting device.

BACKGROUND

Recently, a nitride semiconductor light emitting device, a light emitting device capable of generating light having a wide range of wavelength bands, including monochromatic light such as blue, green, or the like, has come to prominence in relevant technical sectors in which it may be applied to a backlight unit (BLU), an electronic device, a general illumination device, or the like, beyond the existing simple display or portable liquid crystal display markets.

As the purposes of nitride semiconductor light emitting devices have been diversified, currents applied thereto have also been diversified. A mobile phone is operated with a low applied current of about 20 mA, and as nitride semiconductor light emitting devices have increasingly been used as high output light emitting devices in BLUs and general illumination devices, currents applied thereto have varied from 100 mA to 350 mA or more.

The increase in strength of currents applied to nitride semiconductor light emitting devices has led to an increase in current density of the light emitting devices, and in the case of nitride semiconductor light emitting devices based on InGaN/GaN, internal quantum efficiency has sharply reduced as the density of applied currents has increased. Thus, in order to address this problem, there have been attempts to introduce a current spreading layer between an n-type nitride layer and an active layer to enhance electron spreading efficiency in a horizontal direction to thus increase internal quantum efficiency.

However, strain increases due to a difference in lattice constants. Thus, an influence of a piezoelectric field effect has increased which significantly degrades quantum efficiency in an active layer.

Accordingly, there exists a need for further improvements in semiconductor light emitting devices which include a current spreading layer capable of minimizing an influence of a piezoelectric field effect and improving forward voltage characteristics and/or luminous efficiency.

SUMMARY

An aspect of the present application provides a nitride semiconductor light emitting device including a current spreading layer that minimizes an influence of a piezoelectric field effect and improves forward voltage characteristics and/or luminous efficiency.

According to an aspect of the present application, there is provided a nitride semiconductor light emitting device. The device includes first and second type nitride semiconductor layers. An active layer is disposed between the first and second type nitride semiconductor layers and includes quantum barrier layers and quantum well layers which are alternately laminated. A current spreading layer is disposed between the second type nitride semiconductor layer and the active layer and includes first nitride thin films and second nitride thin films which are alternately laminated. The first nitride thin films have band gaps larger than those of the second nitride thin films. A first plurality of first nitride thin films are positioned at outer first and second sides of the current spreading layer. The first plurality of first nitride thin films has a thickness greater than that of a second plurality of first nitride thin films positioned between the first plurality of first nitride thin films.

In certain examples, the first and second type nitride semiconductor layers are p-type and n-type nitride semiconductor layers, respectively.

The thickness of the second plurality of first nitride thin films positioned between the first plurality of first nitride thin films may range from 60% to 90% of the thickness of the first plurality of first nitride thin films s.

The thickness of the first plurality of first nitride thin films may range from 4 nm to 5 nm, and the thickness of the second plurality of first nitride thin films may range from 3 nm to 4 nm. In this case, the thickness of the second nitride thin films may range from 0.5 nm to 3 nm.

In an example of the present application, the energy band gaps of the second nitride thin films decrease toward the active layer. In another example, the energy band gaps of the second nitride thin films increase toward the active layer.

In this example of the present application, five to nine pairs of the first and second nitride thin films may be provided.

The first nitride thin films may be GaN, and the second nitride thin films may be $In_xGa_{1-x}N$, wherein x may be adjusted within a range of 0.01 to 0.2. In this case, a difference between the content (x) of indium of at least one of the second nitride thin films and another second nitride thin film adjacent thereto may range from 0.02 to 0.05.

In another example of the present application, the energy band gaps of the second nitride thin films decrease and then increase toward the active layer. In another example of the present application, the energy band gaps of the second nitride thin films increase and then decrease toward the active layer.

Also, in this example of the present application, five to nine pairs of the first and second nitride thin films may be provided.

The first nitride thin films may be GaN, and the second nitride thin films may be $In_xGa_{1-x}N$, wherein x may be adjusted within a range of 0.01 to 0.2. In this case, a difference between the content (x) of indium of at least one of the second nitride thin films and another second nitride thin film adjacent thereto may range from 0.02 to 0.05.

According to another aspect of the present application, there is provided a nitride semiconductor light emitting device. The device includes a first and second conductivity type nitride semiconductor layers. An active layer is disposed between the first and second conductivity type nitride semiconductor layers and includes quantum barrier layers and quantum well layers which are alternately laminated. A current spreading layer is disposed between the second conductivity type nitride semiconductor layer and the active layer and includes first nitride thin films and second nitride thin films which are alternately laminated. The first nitride thin films have band gaps larger than those of the second nitride thin films. A first plurality of first nitride thin films are positioned at outer first and second sides of the current spreading layer. The first plurality of first nitride thin films have a thickness greater than that of a second plurality of first nitride thin films positioned between the first plurality of first nitride thin films.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

Figure 1A:
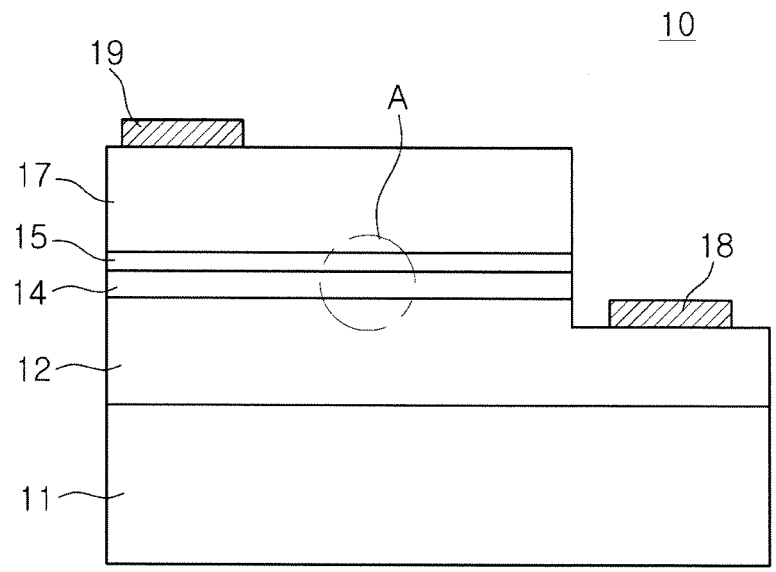
FIGS. 1A and 1B are a side sectional view and a partially enlarged view of a nitride semiconductor light emitting device according to an example of the present application, respectively.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Examples of the present application will now be described in detail with reference to the accompanying drawings. The application may, however, be embodied in many different forms and should not be construed as being limited to the examples set forth herein. Rather, these examples are provided so that this disclosure will be thorough and complete, and will fully convey the scope of the application to those skilled in the art. In the drawings, the shapes and dimensions of elements may be exaggerated for clarity, and the same reference numerals will be used throughout to designate the same or like components.

Figure 1B:
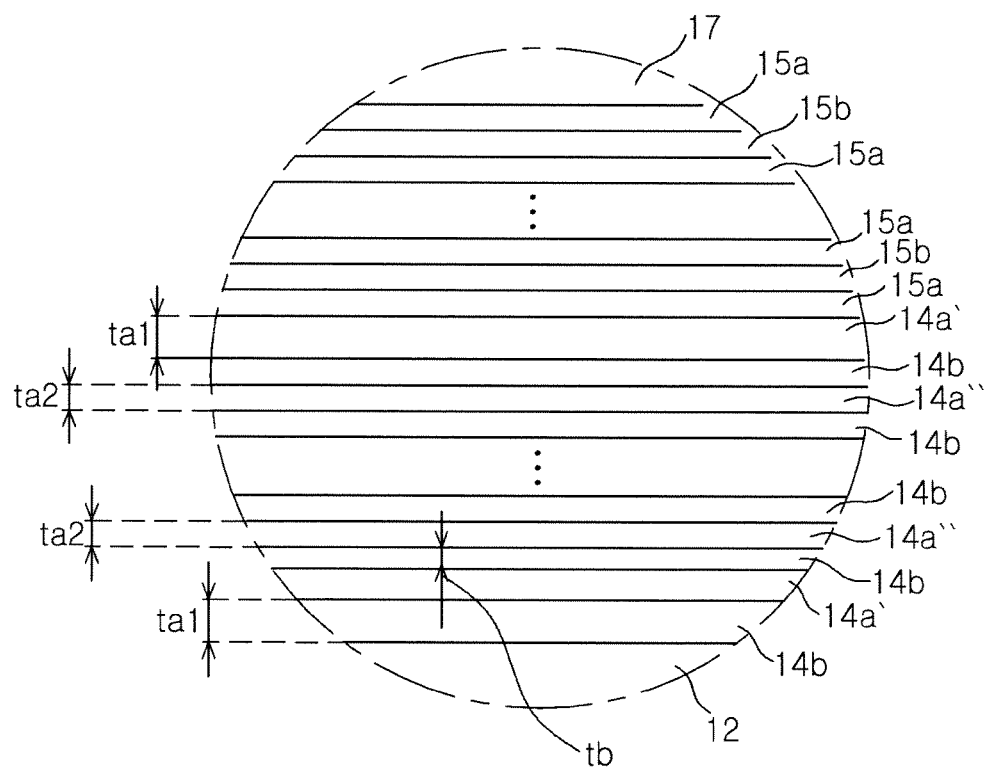

FIG. 1A is a side sectional view of a nitride semiconductor light emitting device according to an example of the present application, and FIG. 1B is an enlarged view of portion 'A' of the nitride semiconductor light emitting device illustrated in FIG. 1A.

As shown in FIG. 1A, a nitride semiconductor light emitting device 10 includes an n-type nitride semiconductor layer 12, an active layer 15, and a p-type nitride semiconductor layer 17 sequentially formed on a substrate 11.

An n-side electrode 18 is formed on an upper surface of a portion of the n-type nitride semiconductor layer 12 exposed upon being mesa-etched, a p-side electrode 19 is formed on an upper surface of the p-type nitride semiconductor layer 17.

The nitride semiconductor light emitting device 10 according to the present example includes a current spreading layer 14 formed between the active layer 15 and the n-type nitride semiconductor layer 12. As illustrated in FIG. 1B, the active layer 15 has a multi-quantum well (MQW) structure including quantum barrier layers 15a and quantum well layers 15b.

In the current spreading layer 14, first nitride thin films 14a' and 14a" and second nitride thin films 14b are alternately laminated. The current spreading layer 14 employed in the present example is illustrated to include five pairs of first and second nitride thin films 14'a, 14a", and 14b, but the present application is not limited thereto and the current spreading layer 14 may include five to nine pairs of first and second nitride thin films.

Figure 2:
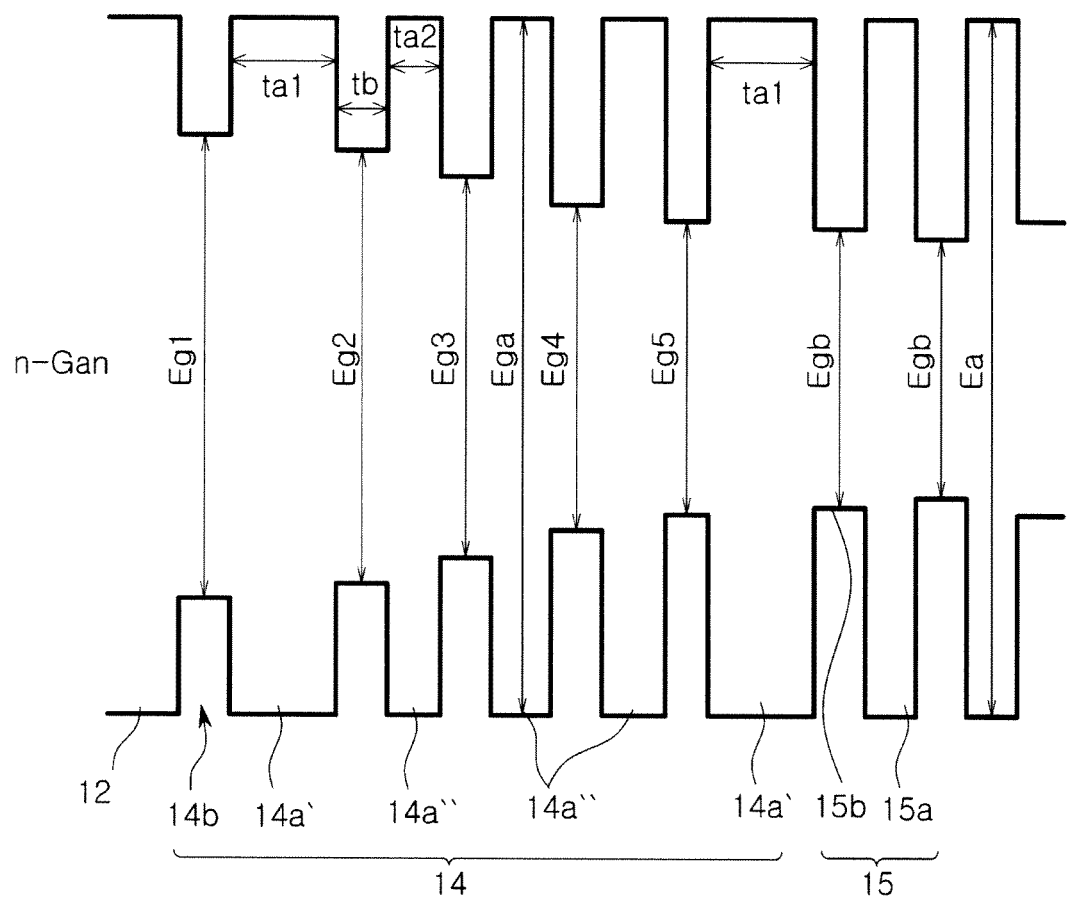
FIG. 2 is a band gap diagram showing an active layer and a current spreading layer employed in the nitride semiconductor light emitting device illustrated in FIG. 1A.

As shown in FIG. 2, the first nitride thin films 14a' and 14a" have a band gap Ega larger than band gaps Eg1 to Eg5 of the second nitride thin film 14b, respectively. Among the first nitride thin films 14a' and 14a", the first plurality of first nitride thin films 14a' positioned at outer first and second sides of the current spreading layer 14 have a thickness ta1 greater than a thickness ta2 of the second plurality of first nitride thin films 14a" positioned between the first plurality of first nitride thin films 14a'. By forming the first plurality of first nitride thin films 14a' adjacent to the outside such that they have a relatively large thickness, a piezoelectric field effect, mainly affecting a total polarization value in the current spreading layer 14, is reduced to thus improve luminance and an operating voltage.

The thickness ta2 of the second plurality of first nitride thin films 14a" may be within a range of 60% to 90% of the thickness ta1 of the first plurality of first nitride thin films 14a' positioned at outer first and second sides of the current spreading layer 14.

Preferably, the thickness ta1 of the first plurality of first nitride thin films 14a' may range from 4 nm to 5 nm, and the thickness ta2 of the second plurality of first nitride thin films 14a" may range from 3 nm to 4 nm. In this case, the thickness tb of the second nitride thin films 14b may range from 0.5 nm to 3 nm. In this manner, the current spreading layer 14 may have a superlattice structure.

As shown in the example of FIG. 2, the energy band gaps of the second nitride thin films 14b may be reduced toward the active layer 15. Namely, the energy band gaps of the second nitride thin films 14b may be reduced toward the active layer 15: Eg1>Eg2>Eg3>Eg4>Eg5. The first nitride thin films 14a' and 14a" may be GaN and the second nitride thin films 14b may be $In_xGa_{1-x}N$ (x>0).

Since piezoelectric polarization is a dominant factor of the total polarization value in the current spreading layer 14, based on InGaN similar to the active layer 15, the total polarization value can be optimized by adjusting the band gap. As a result, the stress between the current spreading layer 14 and the active layer 15 can be minimized and both luminance and an operating voltage can be improved.

For example, in order to optimize the polarization value, in the present example, the second nitride film 14b may be formed such that a band gap thereof is gradually reduced toward the active layer 15. Here, the second nitride film 14b, closest to the active layer 15, may be reduced to be equal or similar to the band gap Egb of the quantum well layer 15b of the active layer 15.

The band gap adjustment may be realized by adjusting a doping concentration of indium (In), and in detail, a desired indium grading structure may be realized by adjusting the doping concentration of indium (In) by using a growth temperature.

For example, by lowering a growth temperature of the second nitride film 14b toward the active layer 15 in stages, the content of indium (In) of the second nitride film 14b may be gradually increased similar to the band diagram illustrated in FIG. 2.

In order to optimize a piezoelectric polarization effect according to the indium grading structure, it is preferable that the content (x) of indium is adjusted to be within a range of 0.01 to 0.2. In this example, a difference between the content (x) of indium of the second nitride thin film and the other second nitride thin film adjacent thereto may range from 0.02 to 0.05.

In the present example, the current spreading layer in which the first and second nitride films are alternately laminated is employed. At least one first nitride film positioned on the outside at both sides may be set to have a thickness greater than that of the other first nitride film to thereby alleviate a problem according to the grading structure and improve the piezoelectric field effect. In line with this, the grading structure may be variably modified in consideration of luminance efficiency and/or the characteristics of an operating voltage (forward voltage characteristics).

The grading structure that may be employed in the present example may have various shapes according to a grading tendency, namely, increased and decreased band gaps and patterns thereof. FIGS. 3 through 8 illustrate band diagrams (only conduction bands are shown) of various current spreading layers that may be employed in the nitride semiconductor light emitting device according to an example of the present application.

Figure 3:
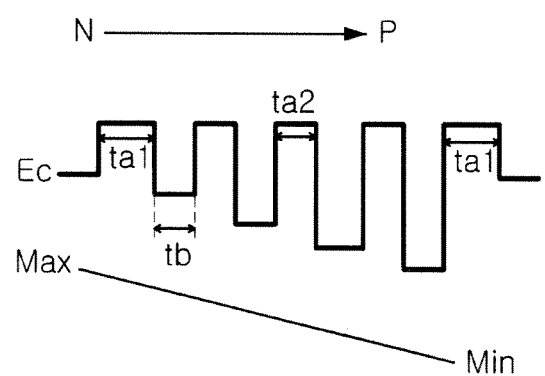
FIGS. 3 and 4 are band gap diagrams showing a current spreading layer employed in a nitride semiconductor light emitting device according to a first example of the present application.

First, a current spreading layer illustrated in FIG. 3 has five pairs of first and second nitride films. As shown in FIG. 3, similar to the former example, band gaps of the second nitride films are gradually reduced toward the active layer. The band gaps of the second nitride film may be graded by adjusting the content of indium (In).

The thickness tb of the second nitride films is uniform, while the thickness ta1 of the first nitride films positioned on the outside at both sides may be greater than the thickness ta2 of the other first nitride film.

Figure 4:
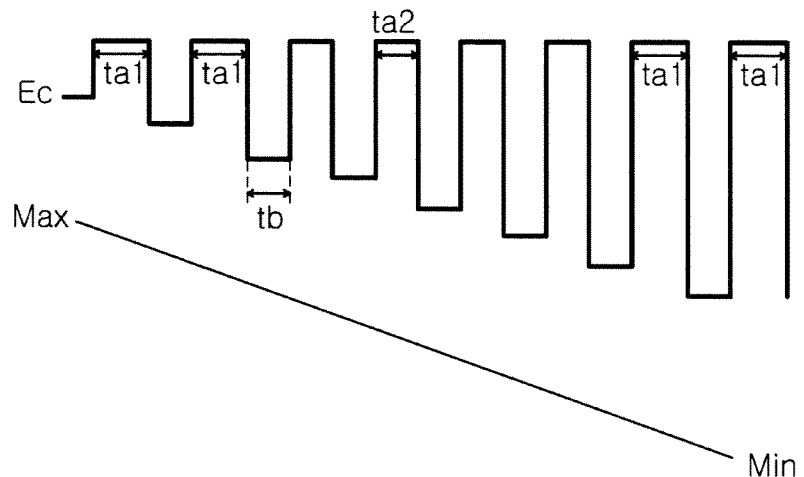

Similar to the grading structure illustrated in FIG. 3, a current spreading layer illustrated in FIG. 4 has a grading structure in which the band gaps of the second nitride films are gradually reduced toward the active layer, but the current spreading layer illustrated in FIG. 4 includes eight pairs of first and second nitride films.

In this manner, the number of laminations may be adjusted as necessary, and the thickness of the films may be appropriately designed in relation thereto. For example, in the current spreading layer structure having eight pairs of larger numbers of first and second nitride films, two first nitride films positioned on the outside at both sides may be designed to have the thickness ta1 greater than the thickness ta2 of the other first nitride film.

Figure 5:
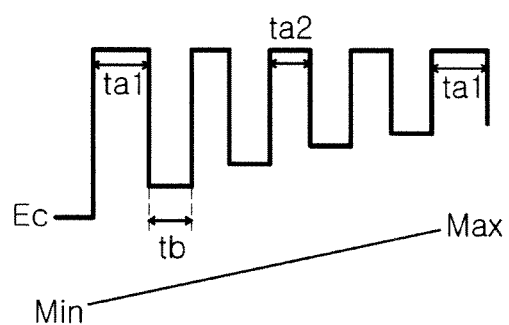
FIG. 5 is a band gap diagram showing a current spreading layer employed in a nitride semiconductor light emitting device according to a second example of the present application.

A current spreading layer illustrated in FIG. 5 includes five pairs of first and second nitride films, similar to that of FIG. 3. However, unlike the former examples, in the current spreading layer illustrated in FIG. 5, band gaps of the second nitride films are gradually increased toward the active layer.

Meanwhile, the thickness tb of the second nitride films is uniform, but the thickness ta1 of the first nitride films positioned on the outside at both sides may be greater than the thickness ta2 of the other first nitride film.

The examples illustrated in FIGS. 3 through 5 only show the tendency in which the band gaps of the second nitride films are increased or decreased. However, as shown in FIGS. 6 through 8, band gaps may have different patterns; they are increased and then decreased, or decreased and then increased.

Figure 6:
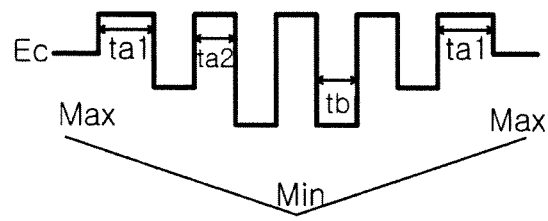
FIGS. 6 and 7 are band gap diagrams showing a current spreading layer employed in a nitride semiconductor light emitting device according to a third example of the present application.

A current spreading layer illustrated in FIG. 6 includes five pairs of first and second nitride films. As illustrated in FIG. 6, band gaps of the second nitride films are reduced and then increased toward the active layer. The grading of the band gaps of the second nitride films may be obtained by adjusting the content of indium (In), and may be implemented in a manner of lowering and then increasing a growth temperature.

Also, in this example, the thickness tb of the second nitride films is uniform, while the thickness ta1 of the first nitride films positioned on the outside at both sides is greater than the thickness ta2 of the other first nitride film.

Figure 7:
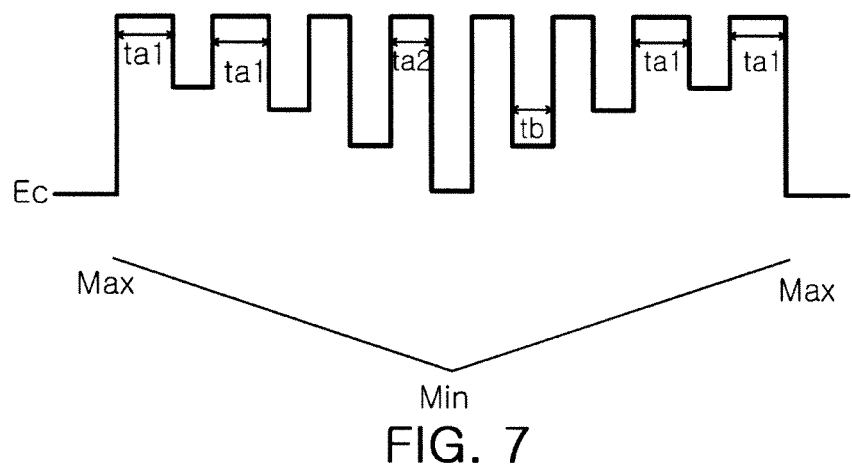
Figure 8:
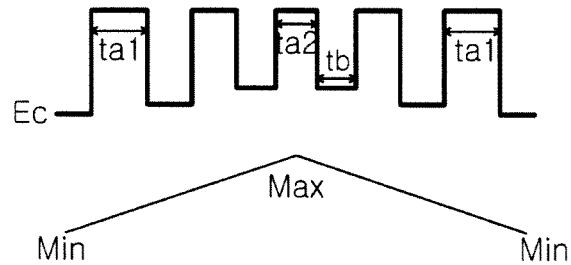
FIG. 8 is a band gap diagram showing a current spreading layer employed in a nitride semiconductor light emitting device according to a fourth example of the present application.

Similar to the example illustrated in FIG. 6, a current spreading layer illustrated in FIG. 7 has a grading structure in which band gaps of second nitride films are reduced and then increased toward the active layer, but in this case, the current spreading layer has eight pairs of first and second nitride films.

In the structure of the current spreading layer having a relatively large number (eight pairs) of first and second nitride films according to the present example, like the configuration illustrated in FIG. 4, two first nitride films positioned on the outside at both sides may be designed to have a thickness ta1 greater than the thickness ta2 of the other first nitride film.

A current spreading layer illustrated in FIG. 8 has five pairs of first and second nitride films in a similar manner to FIG. 6, but reversed with respect to the foregoing examples, band gaps of the second nitride films being increased and then decreased toward the active layer.

Meanwhile, the thickness tb of the second nitride films is uniform, while the first nitride films positioned on the outside at both sides may have a thickness ta1 greater than the thickness ta2 of the other first nitride films.

An operation and effect of the present application will hereinafter be described in detail through specific examples of the present application.

Embodiments 1A and 1B

Nitride semiconductor light emitting devices including an active layer having five pairs of $In_{0.2}Ga_{0.8}N$ quantum well layers and GaN quantum barrier layers were fabricated, and a current spreading layer was introduced between an n-type nitride semiconductor layer and the active layer.

The current spreading layer introduced in the present embodiments 1A and 1B included five pairs of GaN nitride films and $In_xGa_{1-x}N$ nitride films. Here, one GaN nitride film on the outside at both sides, respectively, among the five GaN nitride films, was grown to have a thickness of 5 nm, while the other remaining three GaN nitride films were grown to have a thickness of 4 nm. The five $In_xGa_{1-x}N$ nitride films were grown to have the same thickness of 2.5 nm.

As grading conditions of the second nitride films, indium content (x) conditions as shown in Table 1 below were set and the $In_xGa_{1-x}N$ nitride films were grown such that band gaps thereof were gradually decreased toward the active layer.

TABLE 1

| Classification | First film | Second film | Third film | Fourth film | Fifth film |
|---|---|---|---|---|---|
| Embodiment 1A | 4% | 7% | 10% | 13% | 16% |
| Embodiment 1B | 1.6% | 5.8% | 10% | 14.2% | 18.4% |

Embodiment 1C

A nitride semiconductor light emitting device was fabricated in the same manner as those of Embodiments 1A and 1B, and a current spreading layer was designed to have nine pairs of GaN nitride films and $In_xGa_{1-x}N$ nitride films.

Two GaN nitride films on the outside at both sides, respectively, among the nine GaN nitride films, were grown to have a thickness of 5 nm, while the other remaining five GaN nitride films were grown to have a thickness of 4 nm. The nine $In_xGa_{1-x}N$ nitride films were grown to have the same thickness of 2.5 nm.

As grading conditions of the second nitride films employed in the present example, indium content (x) conditions as shown in Table 2 below were set and the $In_xGa_{1-x}N$ nitride films were grown such that band gaps thereof were gradually decreased toward the active layer.

TABLE 2

| Classification | First film | Second film | Third film | Fourth film | Fifth film | Sixth film | Seventh film | Eighth film | Ninth film |
|---|---|---|---|---|---|---|---|---|---|
| Embodiment 1C | 4% | 5.5% | 7% | 8.5% | 10% | 11.5% | 13% | 14.5% | 16% |

Embodiments 2A and 2B

Nitride semiconductor light emitting devices were fabricated in the same manner as those of Embodiments 1A and 1B, and a current spreading layer was designed to have five pairs of GaN nitride films and $In_xGa_{1-x}N$ nitride films, respectively.

Also, one GaN nitride film on the outside at both sides, respectively, among the five GaN nitride films, was grown to have a thickness of 5 nm, while the other remaining three GaN nitride films were grown to have a thickness of 4 nm. The five $In_xGa_{1-x}N$ nitride films were grown to have the same thickness of 2.5 nm.

As grading conditions of the second nitride films employed in the present embodiment, indium content (x) conditions as shown in Table 3 below were set and the $In_xGa_{1-x}N$ nitride films were grown such that band gaps thereof were gradually increased toward the active layer.

TABLE 3

| Classification | First film | Second film | Third film | Fourth film | Fifth film |
|---|---|---|---|---|---|
| Embodiment 2A | 16% | 13% | 10% | 7% | 4% |
| Embodiment 2B | 18.4% | 14.2% | 10% | 5.8% | 1.6% |

Embodiments 3A and 3B

Nitride semiconductor light emitting devices were fabricated in the same manner as those of Embodiments 1A and 1B, and a current spreading layer was designed to have nine pairs of GaN nitride films and $In_xGa_{1-x}N$ nitride films, respectively.

Two GaN nitride films on the outside at both sides, respectively, among the nine GaN nitride films, were grown to have a thickness of 5 nm, while the other remaining five GaN nitride films were grown to have a thickness of 4 nm. The nine $In_xGa_{1-x}N$ nitride films were grown to have the same thickness of 2.5 nm.

As grading conditions of the second nitride films employed in the present example, indium content (x) conditions as shown in Table 4 below were set and the $In_xGa_{1-x}N$ nitride films were grown such that band gaps thereof were gradually decreased and then increased toward the active layer.

TABLE 4

| Classification | First film | Second film | Third film | Fourth film | Fifth film | Sixth film | Seventh film | Eighth film | Ninth film |
|---|---|---|---|---|---|---|---|---|---|
| Embodiment 3A | 4% | 7% | 10% | 13% | 16% | 13% | 10% | 7% | 4% |
| Embodiment 3B | 1.6% | 5.8% | 10% | 14.2% | 18.4% | 14.2% | 10% | 5.8% | 1.6% |

Embodiments 4A and 4B

Nitride semiconductor light emitting devices were fabricated in the same manner as those of Embodiments 3A and 3B, and a current spreading layer was designed to have nine pairs of GaN nitride films and $In_xGa_{1-x}N$ nitride films, respectively.

Two GaN nitride films on the outside at both sides, respectively, among the nine GaN nitride films, were grown to have a thickness of 5 nm, while the other remaining five GaN nitride films were grown to have a thickness of 4 nm. The nine $In_xGa_{1-x}N$ nitride films were grown to have the same thickness of 2.5 nm.

As grading conditions of the second nitride films employed in the present example, indium content (x) conditions as shown in Table 5 below were set and the $In_xGa_{1-x}N$ nitride films were grown such that band gaps thereof were gradually increased and then decreased toward the active layer.

TABLE 5

| Classification | First film | Second film | Third film | Fourth film | Fifth film | Sixth film | Seventh film | Eighth film | Ninth film |
|---|---|---|---|---|---|---|---|---|---|
| Embodiment 4A | 16% | 13% | 10% | 7% | 4% | 7% | 10% | 13% | 16% |
| Embodiment 4B | 18.4% | 14.2% | 10% | 5.8% | 1.6% | 5.8% | 10% | 14.2% | 18.4% |

Comparative Example 1

A nitride semiconductor light emitting device was fabricated in the same manner as those of Embodiments 1A and 1B, except for the introduction of a current spreading layer.

Comparative Example 2

A nitride semiconductor light emitting device was fabricated under the same conditions as those of Embodiments 1A and 1B, and a current spreading layer was designed to have five pairs of GaN nitride films and $In_{0.1}Ga_{0.9}N$ nitride films. Here, all the five GaN nitride films were grown to have the thickness of 5 nm, and the five $In_{0.1}Ga_{0.9}N$ nitride films were grown to have the same thickness of 2.5 nm.

Figure 9:
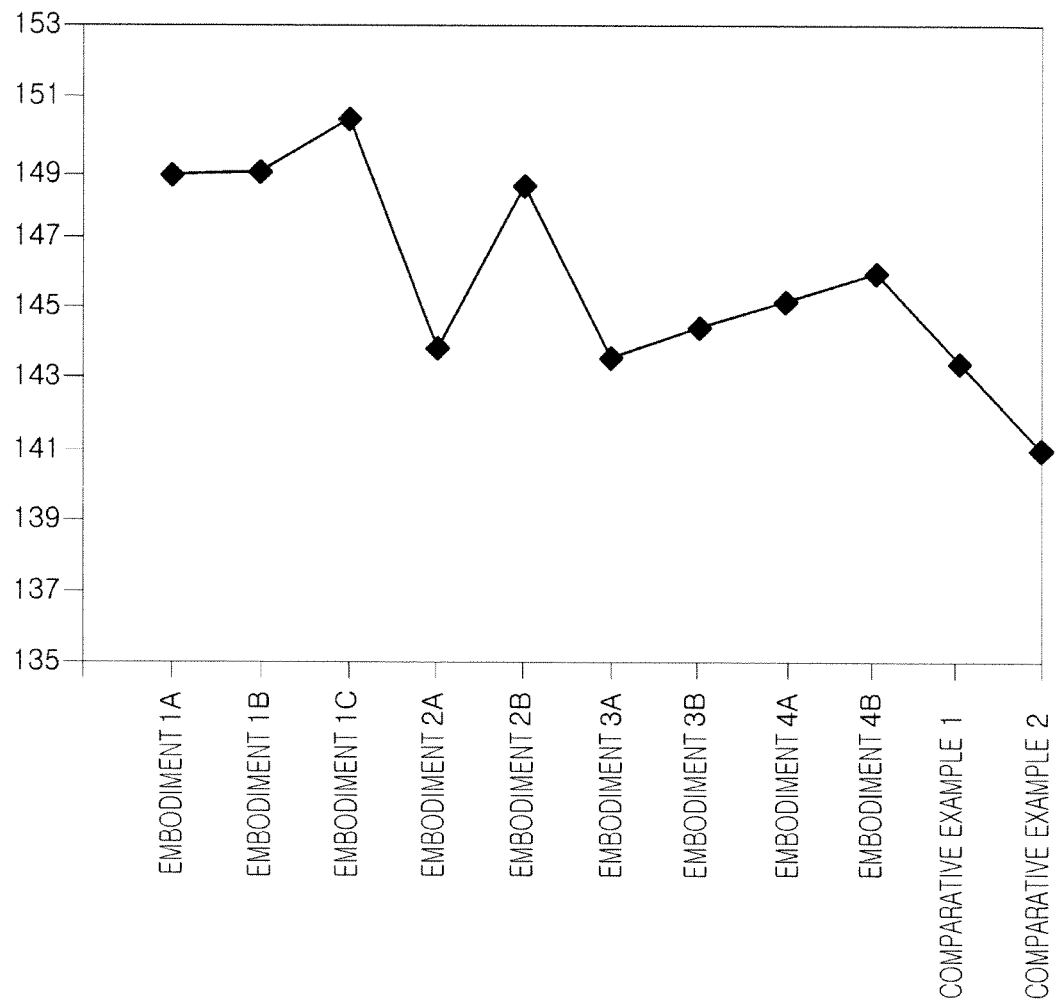
FIG. 9 is a graph showing a comparison of optical powers of nitride semiconductor light emitting devices according to examples of the present application and Comparative Examples.
Figure 10:
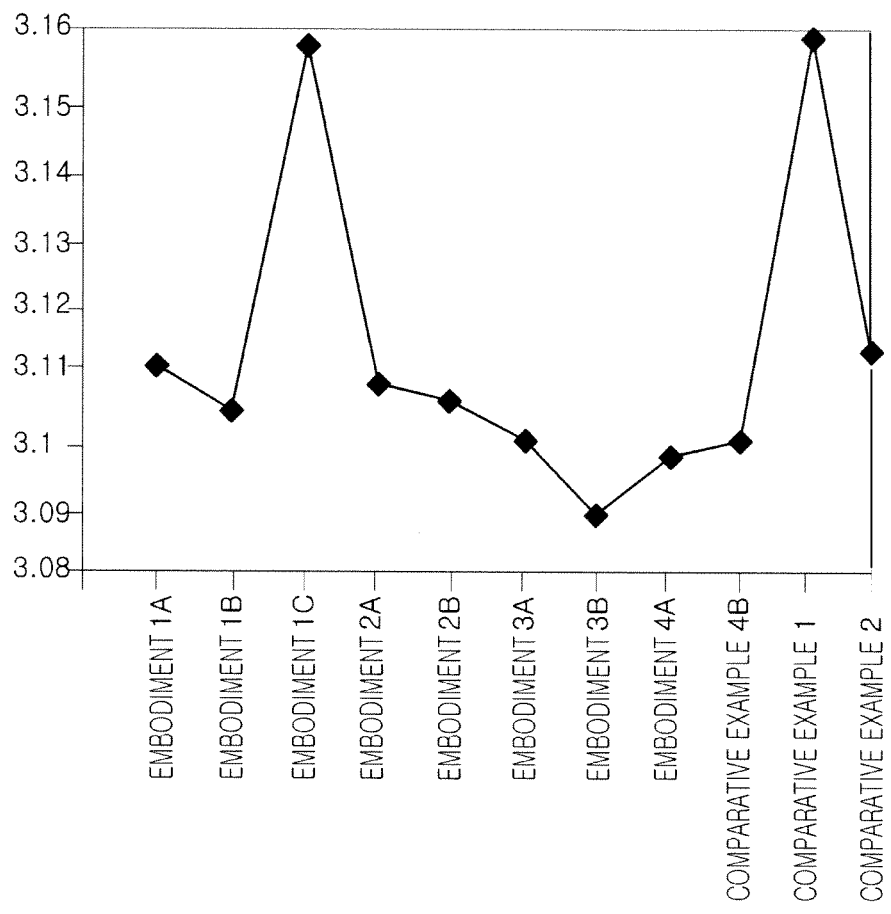
FIG. 10 is a graph showing a comparison of forward voltage characteristics of nitride semiconductor light emitting devices according to examples of the present application and Comparative Examples.

Optical powers and forward voltages of the nitride semiconductor light emitting devices fabricated according to the Embodiments and the Comparative Examples were measured and are shown in the graphs of FIGS. 9 and 10.

With reference to FIG. 9, in comparison to the Comparative Examples 1 and 2, the nitride semiconductor light emitting devices according to Embodiments exhibited relatively high optical power, and in particular, it can be seen that the optical power of the Embodiment 1C was 6.4 mW (4.46%), significantly improved in comparison to Comparative Example 1.

Meanwhile, in terms of an operating voltage, the nitride semiconductor light emitting devices according to the Embodiments, excluding Embodiment 1C, had a relatively low operating voltage in comparison to Comparative Examples 1 and 2, and in particular, it can be seen that that of Embodiment 3B was 0.069V (2.18), exhibiting a great improvement.

As set forth above, according to examples of the application, a nitride semiconductor light emitting device having improved luminous efficiency and forward voltage characteristics by minimizing an influence of a piezoelectric field effect by employing the improved current spreading layer can be provided.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A nitride semiconductor light emitting device comprising:
   first-type and second-type nitride semiconductor layers;
   an active layer disposed between the first-type and second-type nitride semiconductor layers, the active layer including a plurality of quantum barrier layers and a plurality of quantum well layers which are alternately laminated; and
   a current spreading layer disposed between the second type nitride semiconductor layer and the active layer, the current spreading layer including a plurality of first nitride thin films and a plurality of second nitride thin films which are alternately laminated, wherein: the first nitride thin films have band gaps larger than those of the second nitride thin films, and
   a first plurality of first nitride thin films positioned at outer first and second sides of the current spreading layer, the first plurality of first nitride thin films having a thickness greater than that of a second plurality of first nitride thin films positioned between the first plurality of first nitride thin films.

2. The nitride semiconductor light emitting device of claim 1, wherein:
   the first type nitride semiconductor layer is p-type and the second type nitride semiconductor layer is n-type, and
   the thickness of the second plurality of first nitride thin films positioned between the first plurality of first nitride thin films ranges from 60% to 90% of the thickness of the first plurality of first nitride thin films.

3. The nitride semiconductor light emitting device of claim 1, wherein:
   the thickness of the first plurality of first nitride thin films ranges from 4 nm to 5 nm, and
   the thickness of the second plurality of first nitride thin films ranges from 3 nm to 4 nm.

4. The nitride semiconductor light emitting device of claim 3, wherein the thickness of the second nitride thin films ranges from 0.5 nm to 3 nm.

5. The nitride semiconductor light emitting device of claim 1, wherein the energy band gaps of the plurality of second nitride thin films decrease toward the active layer.

6. The nitride semiconductor light emitting device of claim 5, wherein five to nine pairs of the plurality of first and second nitride thin films are provided.

7. The nitride semiconductor light emitting device of claim 6, wherein the first nitride thin films are GaN, and the second nitride thin films are $In_xGa_{1-x}N$,
   wherein x is adjusted within a range of 0.01 to 0.2.

8. The nitride semiconductor light emitting device of claim 7, wherein a difference between the content (x) of indium of at least one of the second nitride thin films and another second nitride thin film adjacent thereto ranges from 0.02 to 0.05.

9. The nitride semiconductor light emitting device of claim 1, wherein the energy band gaps of the plurality of second nitride thin films increase toward the active layer.

10. The nitride semiconductor light emitting device of claim 9, wherein five to nine pairs of the plurality of first and second nitride thin films are provided.

11. The nitride semiconductor light emitting device of claim 10, wherein the first nitride thin films are GaN, and the second nitride thin films are $In_xGa_{1-x}N$,
   wherein x is adjusted within a range of 0.01 to 0.2.

12. The nitride semiconductor light emitting device of claim 11, wherein a difference between the content (x) of indium of at least one of the second nitride thin films and another second nitride thin film adjacent thereto ranges from 0.02 to 0.05.

13. The nitride semiconductor light emitting device of claim 1, wherein energy band gaps of the plurality of second nitride thin films decrease and then increase toward the active layer.

14. The nitride semiconductor light emitting device of claim 13, wherein five to nine pairs of the plurality of first and second nitride thin films are provided.

15. The nitride semiconductor light emitting device of claim 14, wherein:
the first nitride thin films are GaN, and
the second nitride thin films are $In_xGa_{1-x}N$, wherein x is adjusted within a range of 0.01 to 0.2.

16. The nitride semiconductor light emitting device of claim 15, wherein a difference between the content (x) of indium of at least one of the second nitride thin films and another second nitride thin film adjacent thereto ranges from 0.02 to 0.05.

17. The nitride semiconductor light emitting device of claim 1, wherein the energy band gaps of the plurality of second nitride thin films increase and then decrease toward the active layer.

18. The nitride semiconductor light emitting device of claim 17, wherein five to nine pairs of the plurality of first and second nitride thin films are provided.

19. The nitride semiconductor light emitting device of claim 18, wherein:
the first nitride thin films are GaN, and
the second nitride thin films are $In_xGa_{1-x}N$, wherein x is adjusted within a range of 0.01 to 0.2.

* * * * *